United States Patent
Zhang et al.

(10) Patent No.: US 11,769,799 B2
(45) Date of Patent: Sep. 26, 2023

(54) PATTERNED SILICON SUBSTRATE-SILICON GERMANIUM, THIN FILM COMPOSITE STRUCTURE AND PREPARATION METHODS AND APPLICATION THEREOF

(71) Applicant: Institute of Physics, Chinese Academy of Sciences, Beijing (CN)

(72) Inventors: Jianjun Zhang, Beijing (CN); Jieyin Zhang, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 38 days.

(21) Appl. No.: 17/191,333

(22) Filed: Mar. 3, 2021

(65) Prior Publication Data
US 2022/0157942 A1    May 19, 2022

(30) Foreign Application Priority Data
Nov. 16, 2020 (CN) .......................... 202011276489.7

(51) Int. Cl.
*H01L 29/78* (2006.01)
*H01L 29/04* (2006.01)
(Continued)

(52) U.S. Cl.
CPC .......... *H01L 29/155* (2013.01); *H01L 29/045* (2013.01); *H01L 29/165* (2013.01)

(58) Field of Classification Search
CPC ... H01L 29/155; H01L 29/045; H01L 29/165; H01L 21/02381; H01L 21/0243;
(Continued)

(56) References Cited

U.S. PATENT DOCUMENTS

10,840,388 B1 * 11/2020 Burton ................ H01L 29/7813
11,075,078 B1 * 7/2021 Cody .................... H01L 29/105
(Continued)

*Primary Examiner* — Sheikh Maruf
(74) *Attorney, Agent, or Firm* — Foley & Lardner LLP (57) ABSTRACT

The present invention provides a patterned silicon substrate-silicon germanium thin film composite structure comprising a silicon substrate having a patterned structure, a silicon germanium buffer layer positioned on the silicon substrate, a silicon germanium/silicon superlattice layer positioned on the silicon germanium buffer layer and a silicon germanium thin film layer positioned on the silicon germanium/silicon superlattice layer, wherein the silicon germanium/silicon superlattice layer comprises silicon germanium layers and silicon layers which are grown alternately. The present invention also provides a preparation method of the patterned silicon substrate-silicon germanium thin film composite structure of the present invention. The present invention also provides an application of the patterned silicon substrate-silicon germanium thin film composite structure of the present invention in strained silicon devices. The patterned silicon substrate-silicon germanium thin film composite structure provided by the present invention has low threading dislocation density and low surface roughness. A strained silicon device fabricated based on the silicon germanium thin film layer can effectively reduce the scattering of defects to carriers, thereby improving carrier mobility.

14 Claims, 5 Drawing Sheets

(51) Int. Cl.
*H01L 29/15* (2006.01)
*H01L 29/165* (2006.01)

(58) Field of Classification Search
CPC ......... H01L 21/02507; H01L 21/02631; H01L 21/0245; H01L 29/161; H01L 21/02532; H01L 29/30; H01L 21/2053; H01L 29/0657; H01L 29/15
USPC .......................................................... 257/19
See application file for complete search history.

(56) References Cited

U.S. PATENT DOCUMENTS

| | | | |
|---|---|---|---|
| 2013/0240836 A1* | 9/2013 | Lee .................. | H01L 29/66795 257/E21.403 |
| 2014/0264459 A1* | 9/2014 | Choi ................. | H01L 21/02433 257/201 |
| 2015/0162447 A1* | 6/2015 | Lee .................. | H01L 21/02538 257/18 |
| 2016/0197146 A1* | 7/2016 | Augusto ............ | H01L 29/0649 257/22 |
| 2016/0218201 A1* | 7/2016 | Okamoto ........... | H01L 21/8252 |
| 2017/0033186 A1* | 2/2017 | Han .................. | H01L 21/0243 |
| 2018/0166339 A1* | 6/2018 | Hsueh ............... | H01L 21/0254 |
| 2019/0189665 A1* | 6/2019 | Chen ................. | H01L 27/14627 |
| 2019/0279869 A1* | 9/2019 | Weeks ............... | H01L 29/1054 |
| 2019/0317277 A1* | 10/2019 | Stephenson ........ | H01L 29/1054 |
| 2020/0161428 A1* | 5/2020 | Takeuchi ........... | H01L 29/66795 |
| 2020/0161430 A1* | 5/2020 | Takeuchi ........... | H01L 29/165 |
| 2021/0020750 A1* | 1/2021 | Burton .............. | H01L 29/808 |

\* cited by examiner

PATTERNED SILICON SUBSTRATE-SILICON GERMANIUM, THIN FILM COMPOSITE STRUCTURE AND PREPARATION METHODS AND APPLICATION THEREOF

CROSS-REFERENCE TO RELATED APPLICATION

The present application claims the benefit of priority to Chinese Patent Application No. 2020112764897, filed Nov. 16, 2020, the disclosure of which is herein incorporated by reference in its entirety.

TECHNICAL FIELD

The present invention belongs to the field of materials. Specifically, the present invention relates to a patterned silicon substrate-silicon germanium thin film composite structure and a preparation method and application thereof.

BACKGROUND ART

The rapid development of the information age has brought about huge data operation and processing demands, and put forward higher requirements for the performance of microelectronic and optoelectronic devices capable of data operation and processing. As an important semiconductor material, silicon germanium alloy has been widely used in the fields of mobile communication, satellite communication, radio frequency technology, automation technology and photoelectron. Due to the fact that the silicon germanium alloy has good characteristics superior to pure silicon and is compatible with the CMOS process, the device manufactured adopting the silicon germanium alloy and the Si/GeSi heterojunction has excellent performance. Regarding a device made of silicon germanium alloy, firstly it is necessary to meet the challenge that a silicon germanium thin film material with high quality and high flatness shall be epitaxially grown on a silicon-based substrate.

In the prior art, a silicon germanium thin film material is mostly prepared by a graded composition method. This method relieves stress generated from lattice mismatch between the silicon germanium alloy and the silicon substrate by growing a graded layer having a thickness of several microns. Meanwhile, threading dislocations generated in the growth process scatter carriers in the strained silicon quantum well device, so that the carrier mobility is reduced, and the device performance is influenced. In order to obtain strained silicon layer with a high mobility, high quality and high flatness silicon germanium thin film materials are required.

A Japanese research group prepared silicon germanium film having a thickness of about 3 μm, and the root of the square roughness is larger than 1 nm by gas source molecular beam epitaxy and subsequently reduced the roughness to 0.1 nm by a chemical mechanical polishing process (Silicon Isotope Technology for Quantum Computing S. Miyamoto and K. M. Itoh, 2018). The silicon germanium thin film material obtained in the prior art has the following defects: on the one hand, the silicon germanium thin film material obtained by growth has a complicated structure. Silicon germanium thin film grown by conventional chemical vapor deposition (CVD) methods or gas source molecular beam epitaxy (MBE) requires a controlled graded composition and an epitaxial thickness of 3 μm or more. On the other hand, the silicon germanium thin film material obtained by CVD has poor flatness, and silicon germanium thin film for device fabrication require additional chemical mechanical polishing (CMP) process.

DESCRIPTION OF THE INVENTION

It is an object of the present invention to provide a patterned silicon substrate-silicon germanium thin film composite structure having high quality and high flatness. It is another object of the present invention to provide a method for preparing the patterned silicon substrate-silicon germanium thin film composite structure of the present invention. It is still another object of the present invention to provide an application of the patterned silicon substrate-silicon germanium thin film composite structure of the present invention.

The above objects of the present invention are achieved by the following technical solutions.

In the context of the present invention, the term "square block platform" includes cubes and cuboids.

In the context of the present invention, the term "silicon germanium/silicon superlattice layer" includes silicon germanium layers and silicon layers which are alternately grown. In the present invention, the starting layer of the silicon germanium/silicon superlattice layer could be a silicon germanium layer or a silicon layer.

In a first aspect, the present invention provides a patterned silicon substrate-silicon germanium thin film composite structure comprising a silicon substrate having a patterned structure, a silicon germanium buffer layer on the silicon substrate, a silicon germanium/silicon superlattice layer positioned on the silicon germanium buffer layer and a silicon germanium thin film layer positioned on the silicon germanium/silicon superlattice layer, wherein the silicon germanium/silicon superlattice layer comprises silicon germanium layers and silicon layers which are grown alternately.

Preferably, in the patterned silicon substrate-silicon germanium thin film composite structure of the present invention, surface of the silicon substrate has a (001) crystal plane.

Preferably, in the patterned silicon substrate-silicon germanium thin film composite structure of the present invention, the patterned structure comprises a pattern having a maximum dimension of not more than 5 μm in a direction parallel to the [110] direction of the silicon substrate and having a maximum dimension of not more than 5 μm in a direction perpendicular to the [110] direction of the silicon substrate.

Preferably, in the patterned silicon substrate-silicon germanium thin film composite structure of the present invention, the patterned structure comprises a pattern having a maximum dimension of 4.3 μm-5 μm, more preferably 4.8 μm-5 μm, in a direction parallel to the [110] direction of the silicon substrate, and having a maximum dimension of 4.3 μm-5 μm, more preferably 4.8 μm-5 μm, in a direction perpendicular to the [110] direction of the silicon substrate.

Preferably, in the patterned silicon substrate-silicon germanium thin film composite structure of the present invention, the patterned structure comprises a plurality of patterns being the same or different.

Preferably, in the patterned silicon substrate-silicon germanium thin film composite structure of the present invention, the patterned structure comprises a plurality of patterns arranged periodically or non-periodically.

Preferably, in the patterned silicon substrate-silicon germanium thin film composite structure of the present invention, the space between upper surfaces of adjacent patterns of the patterned structure is not less than 200 nm.

Preferably, in the patterned silicon substrate-silicon germanium thin film composite structure of the present invention, the pattern in the patterned structure is a square block platform, a cylinder platform or a truncated cone platform.

Preferably, in the patterned silicon substrate-silicon germanium thin film composite structure of the present invention, the angle between the tangent line of a sidewall surface of the square block platform and the horizontal plane is 80-90°, more preferably 85-90°.

Preferably, in the patterned silicon substrate-silicon germanium thin film composite structure of the present invention, the thickness of the silicon germanium buffer layer is 100-400 nm, more preferably 200-300 nm.

Preferably, in the patterned silicon substrate-silicon germanium thin film composite structure of the present invention, the amount of germanium in the silicon germanium buffer layer is 20 wt %-40 wt %, more preferably 25 wt %-30 wt %.

Preferably, in the patterned silicon substrate-silicon germanium thin film composite structure of the present invention, the silicon germanium/silicon superlattice layer comprises N silicon germanium layers, N or N±1 silicon layers, wherein N is 5-40, more preferably 30-40.

Preferably, in the patterned silicon substrate-silicon germanium thin film composite structure of the present invention, the thickness of the silicon germanium layer in the silicon germanium/silicon superlattice layer is 5-10 nm, more preferably 8-10 nm.

Preferably, in the patterned silicon substrate-silicon germanium thin film composite structure of the present invention, the thickness of the silicon layer in the silicon germanium/silicon superlattice layer is 5-10 nm, more preferably 8-9 nm.

Preferably, in the patterned silicon substrate-silicon germanium thin film composite structure of the present invention, the amount of germanium in the silicon germanium layer of the silicon germanium/silicon superlattice layer is 20 wt %-40 wt %, more preferably 25 wt %-30 wt %.

Preferably, in the patterned silicon substrate-silicon germanium thin film composite structure of the present invention, the thickness of the silicon germanium thin film layer is 100-400 nm, more preferably 200-300 nm.

Preferably, in the patterned silicon substrate-silicon germanium thin film composite structure of the present invention, the amount of germanium in the silicon germanium thin film layer is 20 wt %-40 wt %, more preferably 25 wt %-30 wt %.

Preferably, in the patterned silicon substrate-silicon germanium thin film composite structure of the present invention, the surface roughness of the silicon germanium thin film layer is 0.1-0.5 nm, more preferably 0.1-0.2 nm.

In a second aspect, the present invention provides a preparation method of the pattern silicon substrate-silicon germanium thin film composite structure of the present invention, comprising the steps of:

(1) forming a patterned structure on a silicon substrate;

(2) epitaxially growing a silicon germanium buffer layer on the silicon substrate having the patterned structure;

(3) epitaxially growing silicon germanium layers and silicon layers alternately on the silicon germanium buffer layer to form a silicon germanium/silicon superlattice layer; and (4) epitaxially growing a silicon germanium thin film layer on the silicon germanium/silicon superlattice layer.

Preferably, in the preparation method of the present invention, forming a patterned structure on the silicon substrate in the step (1) is performed by a method comprising the steps of:

growing a $SiO_2$ mask on a (001) surface of a silicon substrate using a plasma enhanced chemical vapor deposition method;

constructing a groove structure on the $SiO_2$ mask along both directions parallel to and perpendicular to the [110] direction of the silicon substrate using a deep ultraviolet lithography technology; and preparing a patterned structure on the groove structure through a reactive ion etching technology, and then removing the $SiO_2$ mask with hydrofluoric acid.

Preferably, in the preparation method of the present invention, epitaxially growing a silicon germanium buffer layer in the step (2) is performed by a method comprising the step of:

epitaxially growing a silicon germanium buffer layer on the silicon substrate having the patterned structure at 320-350° C. by molecular beam epitaxy.

Preferably, in the preparation method of the present invention, epitaxially growing a silicon germanium/silicon superlattice layer in the step (3) is performed by a method comprising the step of:

epitaxially growing a silicon germanium/silicon superlattice structure on the silicon germanium buffer layer at 320-350° C. by molecular beam epitaxy.

Preferably, in the preparation method of the present invention, epitaxially growing a silicon germanium thin film layer in the step (4) is performed by a method comprising the step of:

epitaxially growing a silicon germanium thin film layer on the silicon germanium/silicon superlattice layer by molecular beam epitaxy.

Preferably, in the preparation method of the present invention, epitaxially growing a silicon germanium thin film layer in the step (4) is performed with a method comprising the step of:

epitaxially growing a silicon germanium thin film layer with a thickness of 100-150 nm on the silicon germanium/silicon superlattice layer at 350-400° C. by molecular beam epitaxy, and then epitaxially growing a silicon germanium thin film layer with a thickness of 50-100 nm at 500-600° C.

In a third aspect, the present invention provides an application of the patterned silicon substrate-silicon germanium thin film composite structure of the present invention in strained silicon devices.

The present invention has the following beneficial effects:

The patterned silicon substrate-silicon germanium thin film composite structure provided by the present invention has low threading dislocation density and low surface roughness. A strained silicon device fabricated based on the silicon germanium thin film layer can effectively reduce the scattering of defects to carriers, thereby improving carrier mobility.

BRIEF DESCRIPTION OF THE DRAWINGS

Hereinafter, embodiments of the present invention will be described in detail with reference to the accompanying drawings, in which.

BEST MODE FOR CARRYING OUT THE INVENTION

The present invention is further described in detail below with reference to specific embodiments, which are given for the purpose of illustration only and are not intended to limit the scope of the present invention.

Example 1a (1) A $SiO_2$ mask was grown on a silicon (100) substrate by plasma enhanced chemical vapor deposition. $SiH_4$ and $N_2O$ were used as gas sources, and vapor deposition was performed at 350° C. Then, a groove structure was constructed on the $SiO_2$ mask in both directions parallel to and perpendicular to the [110] direction of the silicon substrate using a deep ultraviolet lithography technology. In the deep ultraviolet lithography, a wavelength of the light source used was 248 nm. Then a periodic square block platform with a square upper surface of 5 μm and a depth of 450 nm was prepared on the groove structure through a reactive ion etching technology. In the reactive ion etching technology, $SF_6$ and $O_2$ were used as gas sources. The $SiO_2$ mask was then removed using hydrofluoric acid.

(2) Next, a silicon germanium buffer layer of 200 nm was epitaxially grown on the silicon (001) substrate with a periodic square block platform at 350° C. by molecular beam epitaxy. In the silicon germanium buffer layer, the amount of germanium was 30 wt %.

(3) Then silicon germanium layers and silicon layers were sequentially and alternately grown on the silicon germanium buffer layer at 350° C. by molecular beam epitaxy to form a silicon germanium/silicon superlattice layer. The silicon germanium/silicon superlattice layer included 35 silicon germanium layers and 35 silicon layers. In the silicon germanium layer of the silicon germanium/silicon superlattice layer, the amount of germanium was 30 wt %. the thickness of the silicon germanium layer was 9 nm and the thickness of the silicon layer was 9 nm.

(4) Subsequently, a silicon germanium thin film layer of 150 nm was grown continually on the silicon germanium/silicon superlattice layer at 350° C. by molecular beam epitaxy. In the silicon germanium thin film layer, the amount of germanium was 30 wt %. Then, a silicon germanium thin film layer of 50 nm was grown continually on the silicon germanium thin film layer with a thickness of 150 nm at 550° C. by molecular beam epitaxy.

Comparative Example 1

A patterned silicon substrate-silicon germanium thin film composite structure was prepared in the same manner as in Example 1, except that no silicon germanium/silicon superlattice layer was grown.

Comparative Example 2

A flat silicon substrate-silicon germanium thin film composite structure was prepared in the same manner as in Example 1, except that the silicon substrate was a flat substrate having no patterned structure.

Comparative Example 3

A patterned silicon substrate-silicon germanium thin film composite structure was prepared in the same manner as in Example 1, except that a groove structure was constructed on a $SiO_2$ mask in both directions parallel to and perpendicular to the [110] direction of the silicon substrate using a deep ultraviolet lithography technology to form a cuboid with a square upper surface of 10 μm and a depth of 450 nm.

Product Characterization

Figure 1:
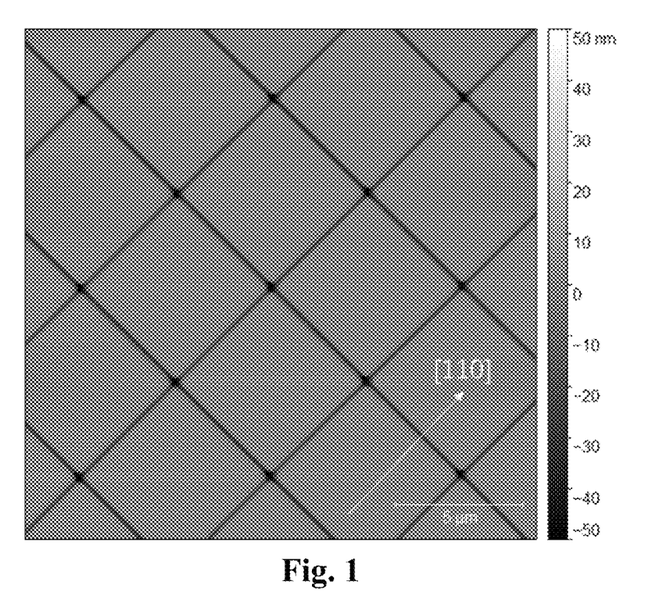
FIG. 1 is an atomic force micrograph image of a silicon substrate having a periodic square block platform on the surface prepared in step (1) of Example 1 of the present invention.

FIG. 1 is an atomic force micrograph image of a silicon substrate having a periodic square block platform on the surface prepared in step (1) of Example 1 of the present invention. FIG. 1 shows that, in step (1) of Example 1, a silicon substrate having a periodic square block platform is prepared. An upper surface of the square block platform is square. the side length of the square is 5000 nm and the space of the square block platform is 200 nm.

Figure 2:
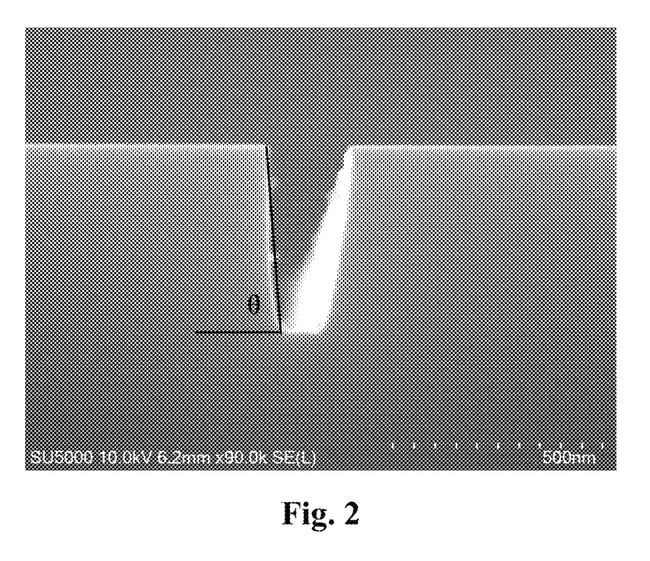
FIG. 2 is a scanning electron micrograph image of a sidewall section of the square block platform prepared in step (1) of Example 1 of the present invention.

FIG. 2 is a scanning electron micrograph image of a sidewall section of the square block platform prepared in step (1) of Example 1 of the present invention. FIG. 2 shows that the patterned silicon substrate of the square block platform prepared in step (1) of Example 1 has a sidewall tilt angle of 85° and a depth of the square block platform of 450 nm.

Figure 3:
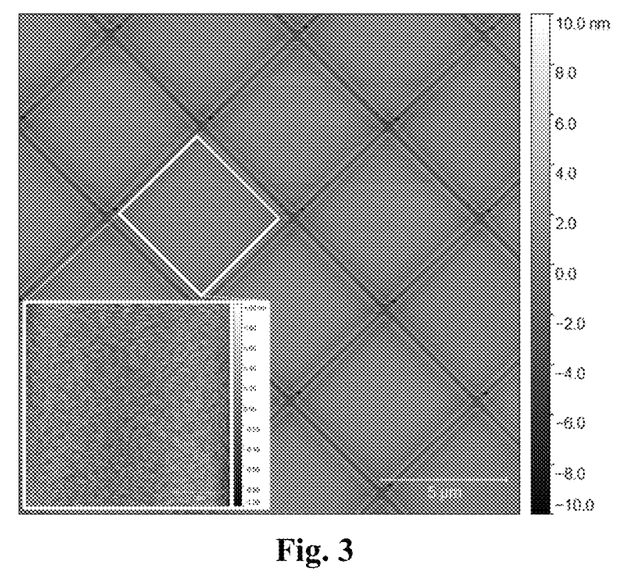
FIG. 3 is a surface atomic force micrograph image of a silicon germanium buffer layer grown in step (2) of Example 1 of the present invention; the inset is an atomic force micrograph image of an upper surface of the square block platform in a white frame.

FIG. 3 is a surface atomic force micrograph image of the silicon germanium buffer layer grown in step (2) of Example 1 of the present invention. The inset is an atomic force micrograph image of the upper surface of the square block platform in a white frame. The inset of FIG. 3 shows that the silicon germanium buffer layer has a surface roughness of 0.146 nm.

Figure 4:
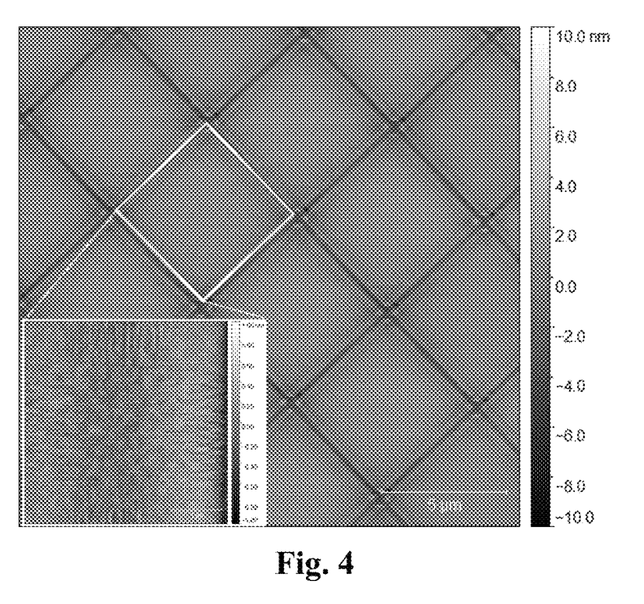
FIG. 4 is a surface atomic force micrograph image of a silicon germanium/silicon superlattice layer grown in step (3) of Example 1 of the present invention; the inset is an atomic force micrograph image of the upper surface of the square block platform in the white frame.

FIG. 4 is a surface atomic force micrograph image of the silicon germanium/silicon superlattice layer grown in step (3) of Example 1 of the present invention. The inset is an atomic force micrograph image of the upper surface of the square block platform in the white frame. The inset of FIG.

4 shows that the silicon germanium/silicon superlattice layer has a surface roughness of 0.162 nm.

Figure 5:
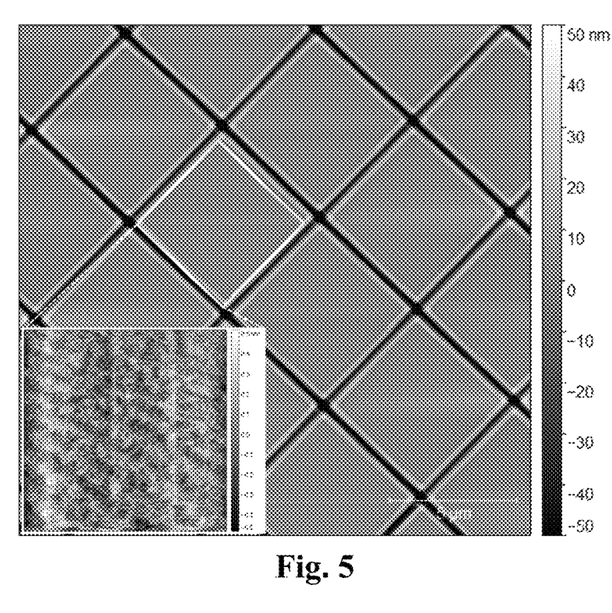
FIG. 5 is a surface atomic force micrograph image of a silicon germanium thin film layer grown in step (4) of Example 1 of the present invention; the inset is an atomic force micrograph image of the upper surface of the square block platform in the white frame.

FIG. 5 is a surface atomic force micrograph image of a silicon germanium thin film layer grown in step (4) of Example 1 of the present invention. The inset is an atomic force micrograph image of the upper surface of the square block platform in the white frame. The inset of FIG. 5 shows that the silicon germanium thin film layer has a surface roughness of 0.163 nm, and no threading dislocations are observed.

Figure 6:
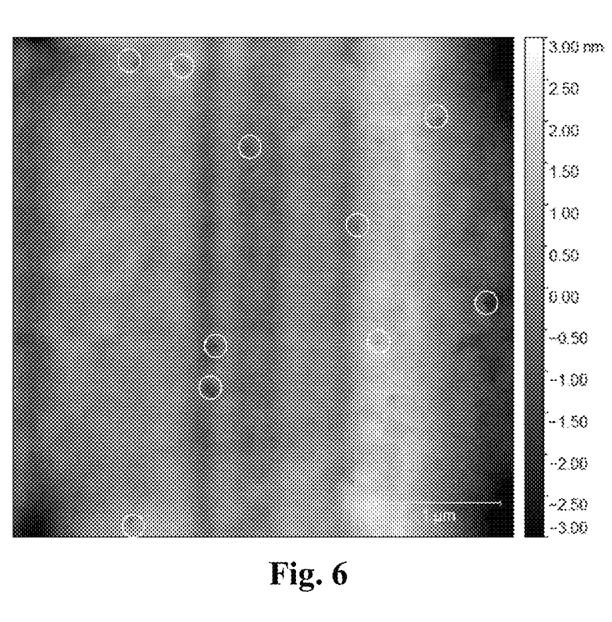
FIG. 6 is a surface atomic force micrograph image of the silicon germanium thin film layer grown in Comparative Example 1.

FIG. 6 is a surface atomic force micrograph image of the silicon germanium thin film layer grown in Comparative Example 1. FIG. 6 shows that the silicon germanium thin film layer prepared in Comparative Example 1 has a surface roughness of 0.741 nm. The surface of the silicon germanium thin film layer prepared in Comparative Example 1 is rougher relative to that of the silicon germanium thin film layer having the silicon germanium/silicon superlattice layer. The white circles in FIG. 6 show the presence of threading dislocations on the surface. FIG. 6 shows that, through growing a silicon germanium/silicon superlattice layer, the surface roughness of the silicon germanium thin film layer can be reduced and the crystal quality of the silicon germanium thin film layer can be improved.

Figure 7:
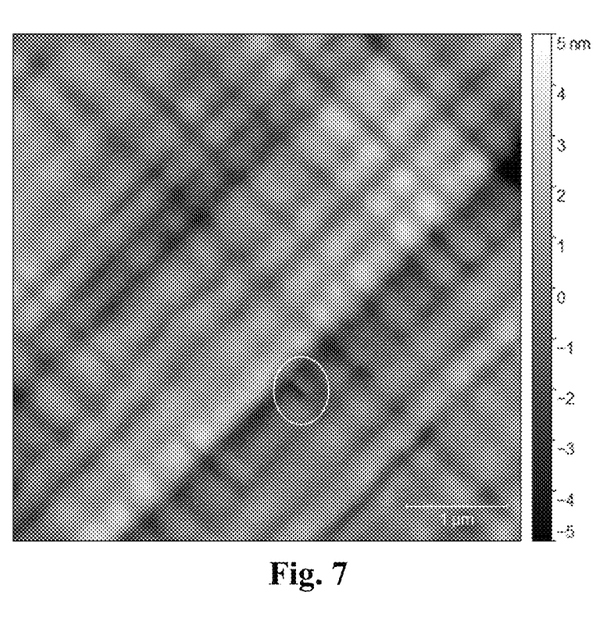
FIG. 7 is a surface atomic force micrograph image of the silicon germanium thin film layer grown in Comparative Example 2.

FIG. 7 is a surface atomic force micrograph image of the silicon germanium thin film layer grown in Comparative Example 2. FIG. 7 shows that the silicon germanium thin film layer prepared in Comparative Example 2 has a surface roughness of 1.185 nm. The white circle in FIG. 7 shows the presence of threading dislocation on the surface. FIG. 7 shows that the silicon substrate having a pattern helps to reduce the silicon germanium surface roughness and improve improving the crystal quality of the silicon germanium thin film layer.

Figure 8:
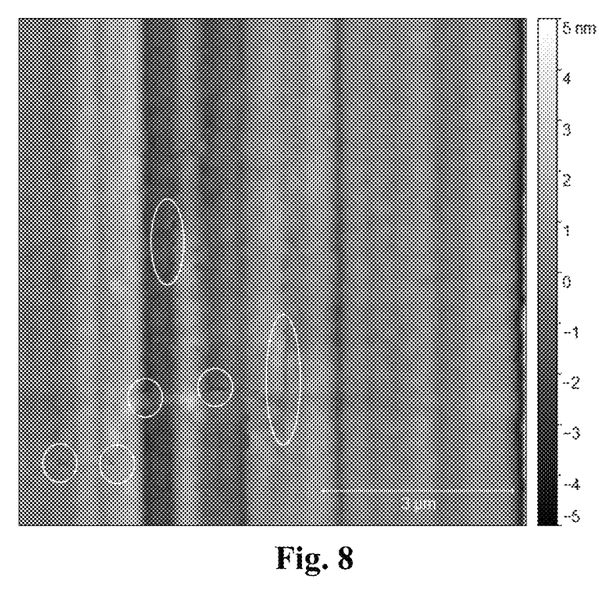
FIG. 8 is a surface atomic force micrograph image of the silicon germanium thin film layer grown in Comparative Example 3.

FIG. 8 is a surface atomic force micrograph image of the silicon germanium thin film layer grown in Comparative Example 3. FIG. 8 shows that the silicon germanium thin film layer prepared in Comparative Example 3 has a surface roughness of 0.945 nm. The white circles in FIG. 8 show the presence of penetrating dislocations on the surface. When a pattern dimension on the silicon substrate is larger than 5 µm, threading dislocations are generated in the silicon germanium thin film layer epitaxially grown on the substrate, thereby reducing the crystal quality of the silicon germanium thin film layer.

Figure 9:
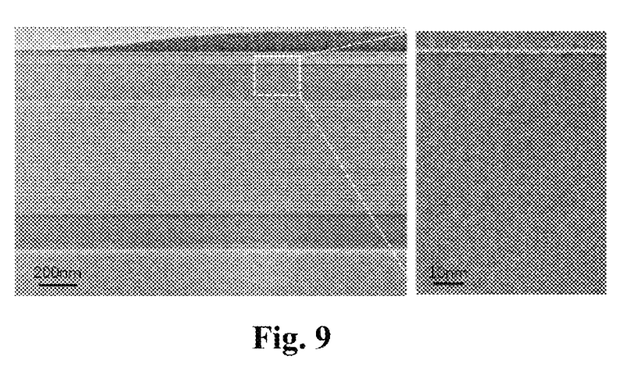
FIG. 9 is a low-magnification transmission electron micrograph image (left) and a high-magnification transmission electron micrograph image (right) of the cross-section of the silicon germanium thin film layer on the patterned silicon substrate prepared in Example 1 of the present invention.

FIG. 9 is a low-magnification transmission electron micrograph image (left) and a high-magnification transmission electron micrograph image (right) of the cross-section of the silicon germanium thin film layer on the patterned silicon substrate prepared in Example 1 of the present invention. No obvious defects are observed in the low-magnification transmission electron micrograph. The high-magnification transmission electron microscope image shows that the structure of the silicon germanium thin film is very perfect, and defects such as dislocations or stacking faults are invisible.

The invention claimed is:

1. A patterned silicon substrate-silicon germanium thin film composite structure comprising a silicon substrate having a patterned structure, a silicon germanium buffer layer positioned on the silicon substrate, a silicon germanium/silicon superlattice layer positioned on the silicon germanium buffer layer and a silicon germanium thin film layer positioned on the silicon germanium/silicon superlattice layer, wherein the silicon germanium/silicon superlattice layer comprises silicon germanium layers and silicon layers which are grown alternately;
a crystal plane of the silicon substrate is a (001) crystal plane; and
the patterned structure comprises a pattern having a maximum dimension of not more than 5 µm in a direction parallel to the [110] direction of the silicon substrate and having a maximum dimension of not more than 5 µm in a direction perpendicular to the [110] direction of the silicon substrate.

2. The patterned silicon substrate-silicon germanium thin film composite structure of claim 1, wherein the patterned structure comprises a pattern having a maximum dimension of 4.3 µm-5 µm in a direction parallel to the [110] of the silicon substrate, and having a maximum dimension of 4.3 µm-5 µm in a direction perpendicular to the [110] of the silicon substrate.

3. The patterned silicon substrate-silicon germanium thin film composite structure of claim 1, wherein the patterned structure comprises a plurality of patterns being the same or different.

4. The patterned silicon substrate-silicon germanium thin film composite structure of claim 3, wherein space between upper surfaces of adjacent patterns of the patterned structure is not less than 200 nm.

5. The patterned silicon substrate-silicon germanium thin film composite structure of claim 1, wherein the pattern in the patterned structure is a square block platform, a cylinder platform, or a truncated cone platform.

6. The patterned silicon substrate-silicon germanium thin film composite structure of claim 1, wherein the silicon germanium buffer layer has a thickness of 100-400 nm.

7. The patterned silicon substrate-silicon germanium thin film composite structure of claim 1, wherein the silicon germanium buffer layer comprises 20 wt %-40 wt % germanium.

8. The patterned silicon substrate-silicon germanium thin film composite structure of claim 1, wherein the silicon germanium/silicon superlattice layer comprises N silicon germanium layers and N or N±1 silicon layers, wherein N is an integer from 5-40.

9. The patterned silicon substrate-silicon germanium thin film composite structure of claim 1, wherein each silicon germanium layer of the silicon germanium/silicon superlattice layer has a thickness of 5-10 nm.

10. The patterned silicon substrate-silicon germanium thin film composite structure of claim 1, wherein each silicon layer of the silicon germanium/silicon superlattice layer has a thickness of 5-10 nm.

11. The patterned silicon substrate-silicon germanium thin film composite structure of claim 1, wherein the silicon germanium layers of the silicon germanium/silicon superlattice layer comprise 20 wt %-40 wt % germanium.

12. The patterned silicon substrate-silicon germanium thin film composite structure of claim 1, wherein the silicon germanium thin film layer has a thickness of 100-400 nm.

13. The patterned silicon substrate-silicon germanium thin film composite structure of claim 1, wherein the silicon germanium thin film layer comprises 20 wt %-40 wt % germanium.

14. A strained silicon device comprising the patterned silicon substrate-silicon germanium thin film composite structure of claim 1.

* * * * *